United States Patent [19]

Boll

[11] Patent Number: 5,596,262
[45] Date of Patent: Jan. 21, 1997

[54] PROCESS FOR MONITORING THE CHARGE LEVEL OF A BATTERY, AND FOR INFORMING THE USER OF THE BATTERY WHEN THE MONITORED CHARGE LEVEL IS NO LONGER RELIABLE

[75] Inventor: Wolf Boll, Weinstadt, Germany

[73] Assignee: Mercedes-Benz AG, Germany

[21] Appl. No.: 332,329

[22] Filed: Oct. 31, 1994

[30] Foreign Application Priority Data

Oct. 29, 1993 [DE] Germany .......................... 43 37 020.9

[51] Int. Cl.$^6$ ................................................ H01M 10/48
[52] U.S. Cl. ................................................................ 320/48
[58] Field of Search ................................ 320/2, 39, 35, 320/48; 324/426, 427, 428, 429, 450; 340/635, 636; 429/61, 90

[56] References Cited

FOREIGN PATENT DOCUMENTS

| | | |
|---|---|---|
| 0493226 | 7/1992 | European Pat. Off. ................ 320/48 |
| 3832839A1 | 3/1990 | Germany . |
| 3832840A1 | 3/1990 | Germany . |
| 4106725A1 | 9/1992 | Germany . |
| 1562132 | 3/1980 | United Kingdom . |

OTHER PUBLICATIONS

Schlenter et al., "Ein Gerät zur Ermittlung des Ladezustandes von Bleiakkumulatoren," pp. 82–87. 1983.
British Search Report dated Jan. 6, 1995.

*Primary Examiner*—Edward H. Tso
*Attorney, Agent, or Firm*—Evenson, McKeown, Edwards & Lenahan P.L.L.C.

[57] ABSTRACT

The invention relates to a method of monitoring the state of charge of the battery of a hybrid vehicle, in which the charge level of the battery is determined by balancing the charge quantities extracted and supplied, and is indicated to the driver. Because of the inaccuracy of the charge balancing, resetting of the balancing from a reliable limit value must be carried out from time to time. In order to assist the operator of the hybrid vehicle in monitoring the battery charge level, according to the invention an error variable is calculated which indicates a discrepancy between the indicated charge level and the actual charge level, and the vehicle operator is provided with an indication if this variable exceeds a maximum value. In a representative embodiment, the error variable is set to be proportional to the current through the battery.

14 Claims, 1 Drawing Sheet

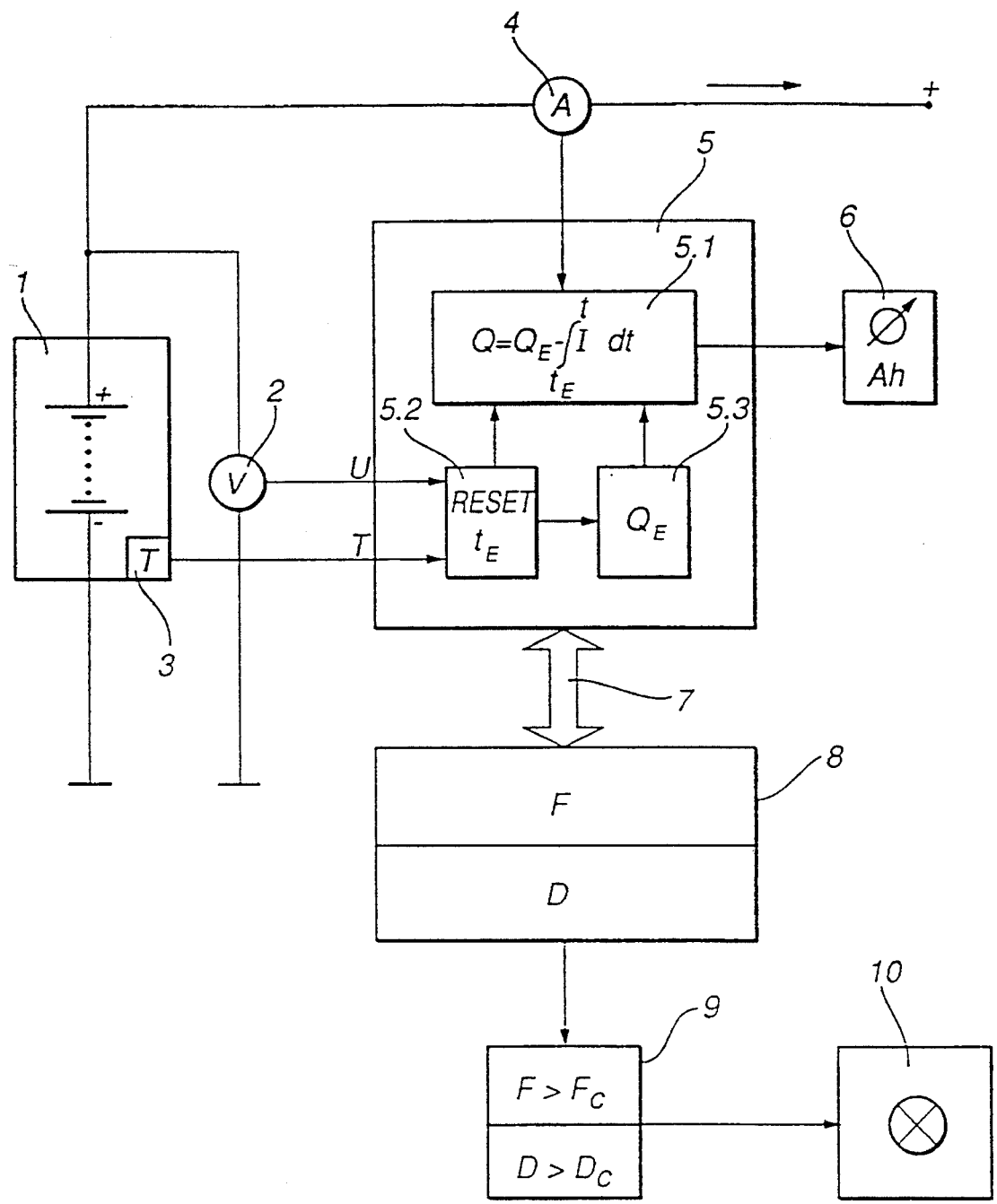

PROCESS FOR MONITORING THE CHARGE LEVEL OF A BATTERY, AND FOR INFORMING THE USER OF THE BATTERY WHEN THE MONITORED CHARGE LEVEL IS NO LONGER RELIABLE

BACKGROUND AND SUMMARY OF THE INVENTION

The invention relates to a method and apparatus for monitoring the battery of a hybrid vehicle, in which the charge level of the battery is determined and is indicated to the operator.

A large number of methods are known which are based on determining the charge level of the battery by integration of the battery current and subsequent balancing of the charge quantities extracted and supplied. Balancing is the normal method in all battery types whose internal resistance and whose no-load voltage in the central charge region are not an unambiguous function of the instantaneous charge level. When balancing, the discharging efficiency and the charging efficiency constitute uncertainty factors which depend in a different manner on the currents passed through, battery temperature, aging and further influencing factors, such as memory effects, which are difficult to determine.

The known methods for charge balancing attempt to take into account the various influencing variables in a suitable manner and to eliminate further error sources, such as those resulting from long-term integration, for example. A comparatively well-proven method and further literature references can be found in Sohleuter, W. and others: "Ein Gerät zur Ermittlung des Ladezustandes yon Bleiakkumulatoren" [A device for determining the charge level of lead-acid accumulators]. In: E and M, Year 102, 1982, Issue 2, pages 82–87.

As a result of the influencing factors, which are difficult to take into account, balancing becomes so imprecise with increasing time and increasing energy throughput, that it is impossible to derive any reliable conclusions from it on the charge level of the battery. It is thus necessary to charge the battery fully repeatedly in order that the balancing can be restarted from a reliable limit value. Since full charge can be sensed well during the charging process on the basis of the rise in temperature, pressure and voltage, this reset of the balancing can be initiated automatically, as a function of physical battery parameters.

While, in the case of purely electric vehicles, the system makes it necessary to return to a charging station virtually daily, so that full charging and hence a reset of the balancing can be carried out regularly with an adequate charging time (for example overnight), in the case of hybrid vehicles this procedure would unnecessarily diminish the convenience and utilization of the vehicle. This is because hybrid vehicles, which are driven by an internal combustion engine and/or an electric motor, need to return to a charging station less frequently, or in special cases not at all, depending on operating conditions.

It is thus possible in the case of hybrid vehicles for the most recent reset of the charge balancing to have been carried out so long ago that the charge level indication deviates greatly from the actual charge supply of the battery. In this case, the operator of the vehicle should fully charge the battery, so that the balancing would be restarted.

The object of the present invention is to provide a method of battery monitoring based on charge balancing in such a manner that the special conditions in hybrid vehicles are better taken into account, and unnoticed unreliability of the charge level indication is prevented.

By means of the method according to the invention, the operator of the vehicle is warned in good time if the charge level indication is no longer dependable so that balancing should be reset from a defined limit value. Furthermore, the method according to the invention ensures that this requirement occurs as rarely as possible, and only when urgently necessary.

Other objects, advantages and novel features of the present invention will become apparent from the following detailed description of the invention when considered in conjunction with the accompanying drawings.

BRIEF DESCRIPTION OF THE DRAWINGS

The single FIGURE of the drawings is a functional block diagram which illustrates the method according to the invention.

DETAILED DESCRIPTION OF THE DRAWINGS

As shown in the FIGURE, a charge balancing computer 5 (known per se) calculates the charge level Q of the battery 1 from various input measurements such as the battery current I, the battery voltage U and the battery temperature T, and drives a charge level indication 6 which may be an analog instrument calibrated in ampere hours Ah. The battery current I is determined by an ammeter 4 inserted into the supply cable of the on-board power supply, a discharge current having a positive mathematical sign and a charging current having a negative mathematical sign. The battery voltage U is recorded by a voltmeter 2, and the battery temperature T by a temperature sensor 3 which is installed in the battery.

The method, which is known per se, for charge balancing comprises a computation unit 5.1 which integrates the measured battery current. (It is of course, possible for discharge currents and charging currents to cancel one another out as a result of the different mathematical sign, and they are thus balanced.) The resultant integral represents the net discharge current and is subtracted from a charge limit value $Q_E$ in order to obtain the remaining residual charge Q which can still be extracted. (The charge limit value $Q_E$ is given, for example, by the rated capacity of the battery at full charge, which may amount to several hundred ampere hours.)

In the simplest case, $Q_E$ is a constant, but correction algorithms are known which take into account that the maximum charge which can be extracted depends on the electrolyte temperature and the mean discharge current intensity. Furthermore, a charge level limit identification unit 5.2 is provided which evaluates input measurements such as the battery voltage U and the battery temperature T to determine, for example, when a charge level limit is reached during a charging phase at time $t=t_E$. That is, the battery is "fully charged". The charge level limit identification unit 5.2 then passes a control signal to the computation unit 5.1, at which point the current integral is set to zero and the integration, that is to say the balancing, is reset.

A further charge level limit which can be sensed well is deep discharge, which is thus likewise suitable as a reference point for balancing. The charge limit value $Q_E$ then corresponds to the charge quantity which can still be extracted at a characteristic deep discharge point.

For a continuously reliable indication of the charge level, it is necessary that a reset of the balancing be carried out as often as possible. This can be achieved by using both full charge and deep discharge as charge level limits to initiate a reset. For this development, a charge level preset value 5.3 is provided which, in the simplest case, consists of a memory in to which charge limit values $Q_E$ predetermined by the computation unit 5.1 are entered. The preset corresponds to the most recently determined charge level limit that is, to the full charge limit value or the deep discharge limit value, based on a control signal from the charge level limit identification unit 5.2.

Since, in the case of hybrid vehicles, a temporary deep discharge of the battery can be accepted because of the two independent drive units, the above measure increases, in an advantageous manner, the rate at which a restart of the balancing is carried out.

According to the invention, a stage for error calculation 8, which interchanges data with the charge balance computer 5 via an interface 7, is provided as a further measure to assist the operator of the hybrid vehicle. The necessary data which must be provided to the error calculation unit 8 for this purpose are the measured battery current I and the control signal for resetting the balancing at time $t_E$. The error calculation unit 8 uses these data to calculate an error variable F from which an instantaneous error range for the indicated charge level can be deduced. In general, the error variable can be represented as an integral over a non-linear function of the battery current I and other battery variables, (such as the battery temperature for example), integrated from the time $t=t_E$ (that is, from the time of resetting of the balancing). A simple algorithm for the error variable F at time t is given by the formula $$F = \int_{t_E}^{t} C|I|dt' + F_S$$

The magnitudes of the current values I measured after resetting ($t=t_E$) of a balance are summed in the first term. The second term $F_S$ represents the influence of further disturbance variables and is initially set to $F_S=0$. For a weighting factor C=1, the error variable then corresponds to the energy throughput which has occurred since the time $t_E$. In one embodiment of the method, the weighting factor can also be selected as a function of battery temperature, battery charge, battery current and the mathematical sign of the battery current. Thus, it may be expedient in the error calculation to use a weighting factor for discharge current which is different than the weighting factor for the charging current when the accuracy of algorithm for charge balancing is different for the respective charge directions.

The error variable F thus determined is supplied to a stage for error assessment 9, where it is compared with a critical error $F_C$. If the error variable F exceeds this critical error $F_C$, a warning signal is passed to a display 10, which indicates visually to the operator of the hybrid vehicle, (by the illumination of an indicator lamp, for example) that the value indicated by the charge level indicator 6 is unreliable, and a deep discharge or a full charge must be carried out in the very near future in order to effect a reset of the charge balancing.

The critical error $F_C$ must be determined empirically. For the example already described, where C=1, a multiple (factor 2 to 10) of the rated capacity can be used on a trial basis.

The calculation of the error variable F can be further improved if the additional term $F_S$ takes into account the effect of self-discharge on the error in the charge indication. This error can be added in proportion to the charge quantity lost by self-discharge and is thus calculated from the time integral of the self discharge current $I_S$ during all the stationary times $t_S$ since $t_E$:

$$F_S = \int_{t_S}^{t} C_S I_S dt'.$$

Since the stationary time (the time in which no battery current is flowing) is repeatedly interrupted by periods of driving, the integral is composed of a sum of individual contributions. The self discharge current $I_S$ and the weighting factor $C_S$ can be selected as functions of further battery parameters, such as the temperature for example. The weighting factor $C_S$ determines the relative weighting of the error term Fs on the total error F.

The error variable F emulates the error in the charge level calculation, and thus enables an up-to-date estimate of the error in the indication.

Moreover, at the end of each balancing interval, it is also possible to determine the actual error in the charge level indication. Specifically, when a charge level limit is reached, the actual charge level corresponds with the charge limit value $Q_E$(new) which is then to be set. However, as a rule, the charge level $Q(t-t_E, \text{old})$ balanced up to that point deviates from this. Thus, in an embodiment of the method according to the invention, the difference value $$D = Q(t-t_E \text{ old}) - Q_E(\text{new})$$

is thus formed and stored at the end of balancing on each occasion, before the balancing is reset and restarted. If the difference value is positive and exceeds a predetermined tolerance limit, so that an unusually large amount of charge has been supplied to the battery overall, it is possible to deduce a battery defect.

The calculation of the difference value D can also be carried out in the stage for error calculation 8, the corresponding values for Q and $Q_E$ being supplied from the charge balance computer 5, via the interface 7. In the stage for error assessment 9, it is determined whether the difference value D exceeds a critical value $D_C$, and if so, the operator of the vehicle is advised of a battery defect by the indication 10, for example by the flashing of the indication lamp.

If the difference value is negative (that is, less subsequent charging was necessary in order to reach the charge level limit than according to the charge level indication), it is possible to deduce that there is an error in the computation method. In this case, the difference value could be used for the purpose of carrying out a self-calibration of the computation method, via adaptation of suitable constants. In this case, both the method for charge balancing and the error calculation method according to the invention can be optimized, for example via adaptation of the constants C and $C_S$.

What conclusions can be produced individually from positive and negative balance discrepancies depends to a large extent on the battery system used and its operating spectrum.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. In a method of monitoring state of charge of a battery comprising the steps of:

detecting charging and discharging current of said battery;

integrating said charging and discharging current over time to determine a net charge quantity extracted from and supplied to said battery;

determining a charge level limit of said battery as a function of physical battery values, including at least one of battery voltage and battery temperature;

comparing said net charge quantity with said charge limit value to determine a charge level of said battery; and resetting said determination of a net charge quantity to zero whenever said charge level of said battery reaches said charge level limit;

a process for informing a user of said battery that a determined charge level is no longer reliable, said method comprising the steps of:

calculating at least one error variable indicative of a range of error of said charge level of said battery determined in said comparing step; and activating an alarm signal when said error variable exceeds a predetermined maximum value.

2. Method according to claim 1, wherein said error variable F is determined by adding to it whenever charge is extracted or supplied, an amount which is in each case calculated from the charge quantity passed through, multiplied by a weighting factor, said error variable also being reset to zero upon resetting of said determination of net charge quantity.

3. Method according to claim 2, wherein a weighting factor for charge extraction is different from a weighting factor for supplying charge.

4. Method according to claim 3, wherein one of the two weighting factors disappears.

5. Method according to claim 2 wherein the weighting factor is determined as a function of battery temperature.

6. Method according to claim 3, wherein the weighting factor is determined as a function of battery temperature.

7. Method according to claim 2, wherein an amount which is proportional to elapsed time is added to the error variable when no charge movement takes place.

8. Method according to claim 1, wherein said error variable is determined such that, on reaching a charge level limit and before said resetting step, a difference value between charge level determined up to that point and the charge level limit value to be set is stored.

9. Method according to claim 8, wherein if the difference value is positive and exceeds a difference limit value, it is determined that a battery defect has occurred and this is indicated.

10. Method according to claim 8, wherein if the difference value is negative, it is determined that there is an inaccuracy in the computation method for determining the charge level, and a self calibration is carried out by adaptation of suitable constants.

11. Method according to claim 1, wherein both a full charge point and a deep discharge point are utilized as charge level limits, and a corresponding charge limit value is preset.

12. In a device comprising a charge balance computer for monitoring state of charge of a battery by integrating charging and discharging current of said battery to determine a net charge quantity, comparing said net charge quantity with a charge limit value to determine a charge level of said battery and resetting said determination of a net charge quantity when said net charge level reaches said charge limit, apparatus for detecting inaccuracy of a determined charge level of the battery, said apparatus comprising:

an error calculation unit for determining a range of error in said determined charge level;

an interface coupling said error calculation unit in communication with said charge balance computer;

an error assessment unit which compares said range of error with predetermined criteria; and an alarm for indicating excessive inaccuracy when said range of error does not comply with said predetermined criteria.

13. Apparatus according to claim 12, wherein current flows continuously through a warning light if a first error threshold is exceeded which represents an acceptable degree of inaccuracy, and wherein current passes through the warning light intermittently if a second error threshold is exceeded which represents an unacceptable degree of inaccuracy.

14. Apparatus according to claim 12, wherein a yellow warning light on the indication is illuminated continuously if a first error threshold is exceeded which represents an acceptable degree of inaccuracy, and wherein a red warning light on the indication illuminates if a second error threshold is exceeded which represents an unacceptable degree of inaccuracy.

* * * * *